(12) United States Patent
Park et al.

(10) Patent No.: US 11,785,820 B2
(45) Date of Patent: *Oct. 10, 2023

(54) ORGANIC LIGHT-EMITTING DISPLAY DEVICE

(71) Applicant: Samsung Display Co., Ltd., Yongin-si (KR)

(72) Inventors: Sungkook Park, Yongin-si (KR); Minwoo Kim, Yongin-si (KR); Woongsik Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,312

(22) Filed: Aug. 1, 2022

(65) Prior Publication Data
US 2022/0376002 A1    Nov. 24, 2022

Related U.S. Application Data

(63) Continuation of application No. 16/927,944, filed on Jul. 13, 2020, now Pat. No. 11,404,487, which is a (Continued)

(30) Foreign Application Priority Data

Jul. 5, 2016  (KR) .................. 10-2016-0085060

(51) Int. Cl.
H10K 59/35      (2023.01)
H10K 50/15      (2023.01)
(Continued)

(52) U.S. Cl.
CPC ............ H10K 59/35 (2023.02); H10K 50/15 (2023.02); H10K 50/171 (2023.02); H10K 50/81 (2023.02);
(Continued)

(58) Field of Classification Search
CPC ............... H10K 50/858; H10K 50/844; H10K 50/8445; H10K 50/585; H10K 50/15;
(Continued)

(56) References Cited

U.S. PATENT DOCUMENTS 7,072,096 B2    7/2006  Holman et al.
8,330,361 B2   12/2012  Kim
(Continued)

FOREIGN PATENT DOCUMENTS

JP    2012-089474 A    5/2012
JP    2013-016271 A    1/2013
(Continued)

OTHER PUBLICATIONS

Extended European Search Report, Application No. 17179133.8, dated Nov. 27, 2017, pp. 1-11.
(Continued)

Primary Examiner — Mohsen Ahmadi
(74) Attorney, Agent, or Firm — Innovation Counsel LLP

(57) ABSTRACT

An organic light-emitting display device with improved light efficiency includes a plurality of pixel electrodes each corresponding one of at least a first, second, or third pixel; a pixel-defining layer covering an edge and exposing a central portion of the pixel electrodes; an intermediate layer over the pixel electrode and including an emission layer; an opposite electrode over the intermediate layer; and a lens layer over the opposite electrode and including a plurality of condensing lenses each having a circular lower surface. An area of the portion of the pixel electrode exposed by the pixel-defining layer is A, and an area of the lower surface of the condensing lens is B. For the first pixel, a ratio B/A ranges from about 1.34 to about 2.63. For the second pixel, B/A ranges from about 1.43 to about 3.00, For the third pixel, B/A ranges from about 1.30 to about 2.43.

21 Claims, 4 Drawing Sheets

Related U.S. Application Data continuation of application No. 16/264,312, filed on Jan. 31, 2019, now Pat. No. 10,714,539, which is a continuation of application No. 15/605,307, filed on May 25, 2017, now Pat. No. 10,224,377.

(51) Int. Cl.
| | | |
|---|---|---|
| *H10K 50/17* | (2023.01) | |
| *H10K 50/81* | (2023.01) | |
| *H10K 50/844* | (2023.01) | |
| *H10K 50/858* | (2023.01) | |
| *H10K 59/122* | (2023.01) | |
| *H10K 50/82* | (2023.01) | |
| *H10K 50/84* | (2023.01) | |
| *H01L 27/146* | (2006.01) | |
| *H10K 50/00* | (2023.01) | |
| *H10K 50/125* | (2023.01) | |

(52) U.S. Cl.
CPC ....... *H10K 50/8445* (2023.02); *H10K 50/858* (2023.02); *H10K 59/122* (2023.02); *H01L 27/14627* (2013.01); *H10K 50/00* (2023.02); *H10K 50/125* (2023.02); *H10K 50/82* (2023.02); *H10K 50/84* (2023.02); *H10K 59/352* (2023.02)

(58) Field of Classification Search
CPC ........ H10K 50/82; H10K 50/84; H10K 59/35; H10K 59/122; H10K 59/352; H01L 27/14627
See application file for complete search history.

(56) References Cited

U.S. PATENT DOCUMENTS

| | | | |
|---|---|---|---|
| 8,674,326 | B2 | 3/2014 | Iwata |
| 9,065,076 | B2 | 6/2015 | Lee et al. |
| 9,368,755 | B2 | 6/2016 | Kim et al. |
| 9,405,188 | B2 | 8/2016 | Lee et al. |
| 9,818,966 | B2 | 11/2017 | Noh |
| 2007/0269917 | A1 | 11/2007 | Hubert et al. |
| 2011/0057221 | A1 | 3/2011 | Sonoda |
| 2011/0109818 | A1 | 5/2011 | Uneda et al. |
| 2012/0074391 | A1* | 3/2012 | Sumida ............... H10K 50/858 257/40 |
| 2012/0097991 | A1 | 4/2012 | Ikeda et al. |
| 2012/0133575 | A1* | 5/2012 | Hasegawa ............ H10K 50/852 345/76 |
| 2012/0199859 | A1* | 8/2012 | Shikina ................ H10K 50/858 257/40 |
| 2012/0313098 | A1 | 12/2012 | Kim et al. |
| 2012/0313501 | A1* | 12/2012 | Mizuno ................ H10K 50/858 313/110 |
| 2013/0001609 | A1 | 1/2013 | Ichinose et al. |
| 2014/0027725 | A1 | 1/2014 | Lim et al. |
| 2014/0034919 | A1 | 2/2014 | Park et al. |
| 2014/0131666 | A1* | 5/2014 | Song .................... H10K 50/858 257/40 |
| 2014/0178605 | A1 | 6/2014 | Kim et al. |
| 2014/0339509 | A1 | 11/2014 | Choi et al. |
| 2015/0041833 | A1 | 2/2015 | Nimura |
| 2015/0048333 | A1 | 2/2015 | Choi et al. |
| 2015/0277187 | A1 | 10/2015 | Akasaka |
| 2016/0064694 | A1* | 3/2016 | Choi .................... H10K 50/865 257/40 |
| 2016/0077328 | A1 | 3/2016 | Chong et al. |
| 2016/0087018 | A1* | 3/2016 | Shim .................... H10K 50/865 257/40 |
| 2016/0126496 | A1 | 5/2016 | Wang et al. |
| 2017/0005286 | A1* | 1/2017 | Yun ......................... H10K 59/35 |
| 2017/0033315 | A1 | 2/2017 | Jang et al. |
| 2017/0133637 | A1 | 5/2017 | Kim et al. |
| 2017/0353181 | A1 | 12/2017 | Kim et al. |
| 2018/0040854 | A1* | 2/2018 | Sung ................. H10K 50/8445 |
| 2018/0089485 | A1 | 3/2018 | Bok |

FOREIGN PATENT DOCUMENTS

| | | |
|---|---|---|
| KR | 10-2010-0073228 A | 7/2010 |
| KR | 10-2013-0108028 A | 10/2013 |
| KR | 10-2013-0129665 A | 11/2013 |
| KR | 10-2014-0012453 A | 2/2014 |
| KR | 10-2014-0123731 A | 10/2014 |
| KR | 10-2015-0019325 A | 2/2015 |
| KR | 10-2015-0072054 A | 6/2015 |
| TW | 201246642 A | 11/2012 |

OTHER PUBLICATIONS

EPO Office Action Report, Application No. 17179133.8, dated Mar. 13, 2019, 6 pages.

* cited by examiner

ORGANIC LIGHT-EMITTING DISPLAY DEVICE

CROSS-REFERENCE TO RELATED APPLICATION

This application is a continuation application of U.S. patent application Ser. No. 16/927,944 filed on Jul. 13, 2020, which is a continuation application of U.S. patent application Ser. No. 16/264,312 filed on Jan. 31, 2019 (now U.S. Pat. No. 10,714,539), which is a continuation application of U.S. patent application Ser. No. 15/605,307 filed on May 25, 2017 (now U.S. Pat. No. 10,224,377), which claims priority under 35 USC § 119 to Korean Patent Application No. 10-2016-0085060, filed on Jul. 5, 2016, in the Korean Intellectual Property Office, the disclosures of which are incorporated herein in their entirety by reference.

BACKGROUND

1. Field

One or more embodiments relate to an organic light-emitting display device, and more particularly, to an organic light-emitting display device with improved light efficiency.

2. Description of the Related Art

Generally, an organic light-emitting display device includes an organic light-emitting diode (OLED) having an intermediate layer including an emission layer between two electrodes. In the organic light-emitting display device, it is generally desirable for light generated from the emission layer to be directed toward a user. However, since light generated from the emission layer of the organic light-emitting display device generally travels in a plurality of directions, brightness in a front direction in which the user is located is low.

SUMMARY

One or more embodiments include an organic light-emitting display device with improved light efficiency. However, this object is merely exemplary, and the scope of the inventive concept is not limited thereto.

Additional aspects will be set forth in part in the description which follows and, in part, will be apparent from the description, or may be learned by practice of the presented embodiments.

According to one or more embodiments, an organic light-emitting display device includes: a plurality of pixel electrodes, each corresponding to one of at least a first pixel, a second pixel, and a third pixel; a pixel-defining layer covering an edge of each of the pixel electrodes and exposing a central portion of each of the pixel electrodes; an intermediate layer over the pixel electrode, the intermediate layer comprising an emission layer; an opposite electrode over the intermediate layer; and a lens layer over the opposite electrode, the lens layer comprising a plurality of condensing lenses each having a circular lower surface. An area of the portion of a pixel electrode corresponding to the first pixel and exposed by the pixel-defining layer is Ar; an area of the lower surface of a condensing lens over the first pixel is Br; and the ratio Br/Ar ranges from about 1.34 to about 2.63. An area of the portion of a pixel electrode corresponding to the second pixel and exposed by the pixel-defining layer is Ag; an area of the lower surface of a condensing lens over the second pixel is Bg; and the ratio Bg/Ag ranges from about 1.43 to about 3.00. An area of the portion of a pixel electrode corresponding to the third pixel and exposed by the pixel-defining layer is Ab; an area of the lower surface of a condensing lens over the third pixel is Bb; and the ratio Bb/Ab ranges from about 1.30 to about 2.43.

When the light emitted from the emission layer is red light, Br/Ar may be about 1.62, when the light emitted from the emission layer is green light, Bg/Ag may be about 1.77, and when the light emitted from the emission layer is blue light, Bb/Ab may be about 1.55.

According to one or more embodiments, a plurality of pixel electrodes, each corresponding to one of at least a red pixel, a green pixel, and a blue pixel; a pixel-defining layer covering an edge of each of the pixel electrodes and exposing a central portion of each of the pixel electrodes; an intermediate layer over the pixel electrode, the intermediate layer including an emission layer; an opposite electrode over the intermediate layer; and a lens layer over the opposite electrode, the lens layer comprising a plurality of condensing lenses each having a quadrangular lower surface. An area of the portion of a pixel electrode corresponding to the red pixel and exposed by the pixel-defining layer is Ar; an area of the lower surface of a condensing lens over the red pixel is Br; and the ratio Br/Ar ranges from about 1.71 to about 3.36. An area of the portion of a pixel electrode corresponding to the green pixel and exposed by the pixel-defining layer is Ag; an area of the lower surface of a condensing lens over the green pixel is Bg; and the ratio Bg/Ag ranges from about 1.83 to about 3.82. An area of the portion of a pixel electrode corresponding to the blue pixel and exposed by the pixel-defining layer is Ab; an area of the lower surface of a condensing lens over the blue pixel is Bb; and the ratio Bb/Ab ranges from about 1.66 to about 3.09.

The ratio Br/Ar may be about 2.07; the ratio Bg/Ag may be about 2.26; and the ratio Bb/Ab may be about 1.98.

The lens layer may include a first lens layer and a second lens layer between the first lens layer and the opposite electrode, the second lens layer having a refractive index less than the refractive index of the first lens layer.

The second lens layer may include a concave portion concave in a direction toward the opposite electrode, the first lens layer may fill the concave portion, and an area of the lower surface of the condensing lens may be an area occupied by the concave portion in a surface of the second lens layer in a direction to the first lens layer.

The concave portion may have a depth of about ⅖ to about ⅗ of a thickness of a non-concave portion of the second lens layer.

The second lens layer may include a photoresist.

The second lens layer may include acrylate.

The first lens layer may include a material cured by irradiation of an ultraviolet ray.

The first lens layer or the second lens layer may include siloxane and at least one of zirconium oxide, aluminum oxide, and titanium oxide.

According to one or more embodiments, an organic light-emitting display device includes: a plurality of pixel electrodes, each corresponding to one of at least a red pixel, a green pixel, and a blue pixel; a pixel-defining layer covering an edge of each of the pixel electrodes and exposing a central portion of each of the pixel electrodes; an intermediate layer over the pixel electrode, the intermediate layer including an emission layer; an opposite electrode over the intermediate layer; and a lens layer over the opposite electrode, the lens layer comprising a plurality of condensing lenses each having a polygonal lower surface. An area of the portion of a pixel electrode corresponding to the red pixel and exposed by the pixel-defining layer is Ar; an area of the biggest circle that would fit inside the polygon of the lower surface of a condensing lens over the red pixel is Br; and the ratio Br/Ar ranges from about 1.34 to about 2.63. An area of the portion of a pixel electrode corresponding to the green pixel and exposed by the pixel-defining layer is Ag; an area of the biggest circle that would fit inside the polygon of the lower surface of a condensing lens over the green pixel is Bg; and the ratio Bg/Ag ranges from about 1.43 to about 3.00. An area of the portion of a pixel electrode corresponding to the blue pixel and exposed by the pixel-defining layer is Ab; an area of the biggest circle that would fit inside the polygon of the lower surface of a condensing lens over the blue pixel is Bb; and the ratio Bb/Ab ranges from about 1.30 to about 2.43.

The ratio Br/Ar may be about 1.62; the ratio Bg/Ag may be about 1.77; and the ratio Bb/Ab may be about 1.55.

The lens layer may include a first lens layer and a second lens layer between the first lens layer and the opposite electrode, the second lens layer having a refractive index less than the refractive index of the first lens layer.

The second lens layer may include a plurality of concave portions each concave in a direction toward the opposite electrode, the first lens layer may fill the concave portions, and each of the areas Br, Bg, and Bb may be an area of a circle of a maximum size inside a corresponding concave portion in a surface of the second lens layer in a direction to the first lens layer.

According to embodiments, an organic light-emitting display device that improves light efficiency may be implemented. However, the scope of the inventive concept is not limited by this effect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
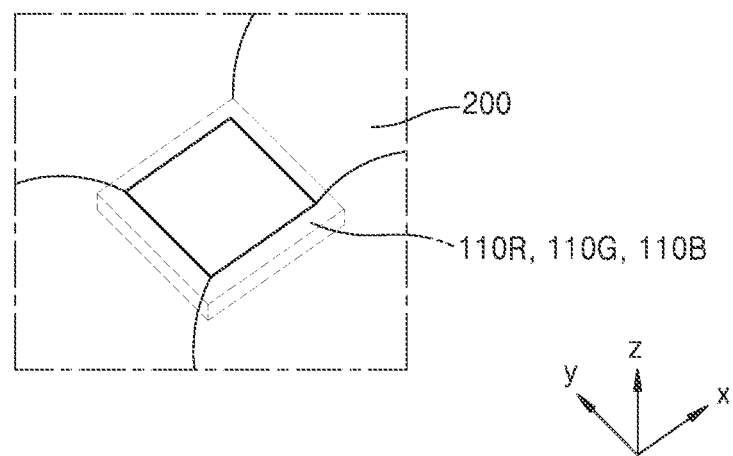
FIG. 1 is a perspective view of a portion of an organic light-emitting display device according to an embodiment.

As the inventive concept allows for various changes and numerous embodiments, exemplary embodiments will be illustrated in the drawings and described in detail in the written description. An effect and a characteristic of the inventive concept, and a method of accomplishing these will be apparent when referring to embodiments described with reference to the drawings. This inventive concept may, however, be embodied in many different forms and should not be construed as limited to the exemplary embodiments set forth herein.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof will be omitted.

As used herein, the term "and/or" includes any and all combinations of one or more of the associated listed items.

Expressions such as "at least one of" when preceding a list of elements, modify the entire list of elements and do not modify the individual elements of the list.

Sizes of elements in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis and the z-axis are not limited to the three axes of the rectangular coordinate system, and may be interpreted in a broader sense. For example, the x-axis, the y-axis, and the z-axis may be perpendicular to one another or may represent different directions that are not perpendicular to one another.

Figure 2:
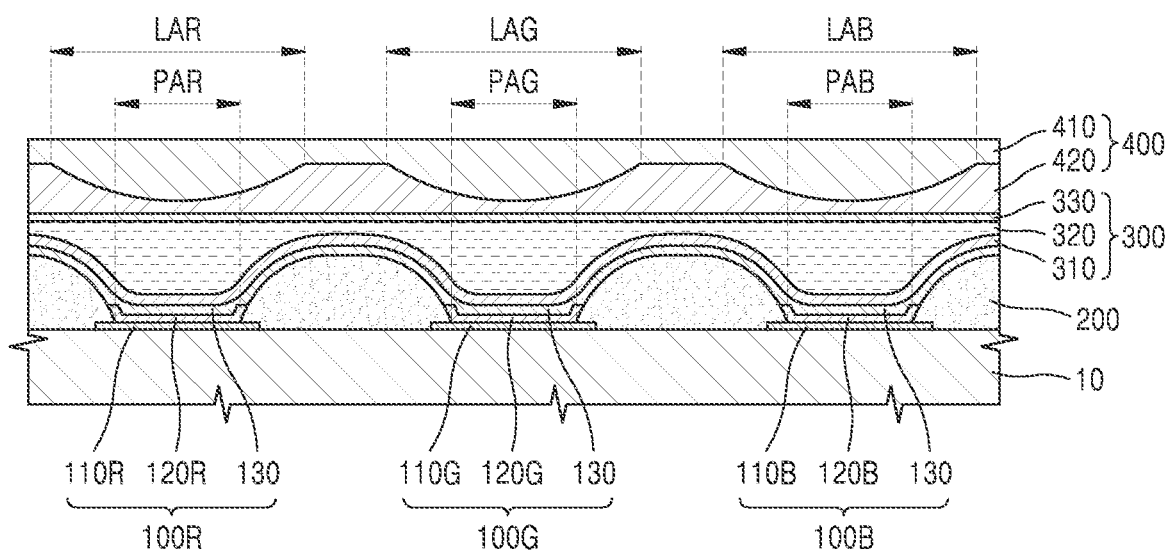
FIG. 2 is a cross-sectional view of a portion of the organic light-emitting display device of FIG. 1.

FIG. 1 is a perspective view of a portion of an organic light-emitting display device according to an embodiment, and FIG. 2 is a cross-sectional view of a portion of the organic light-emitting display device of FIG. 1.

As illustrated in FIGS. 1 and 2, the organic light-emitting display device includes organic light-emitting diodes (OLEDs) as display elements. FIG. 2 illustrates that the organic light-emitting display device includes a red OLED 100R, a green OLED 100G, and a blue OLED 100B. The red OLED 100R, the green OLED 100G, and the blue OLED 100B may be understood as sub-pixels of the organic light-emitting display device. That is, it may be understood that the reference numeral 100R means a red sub-pixel, the reference numeral 100G means a green sub-pixel, and the reference numeral 100B means a blue sub-pixel.

Each of the OLEDs includes a pixel electrode, an intermediate layer over the pixel electrode, the intermediate layer including an emission layer, and an opposite electrode over the intermediate layer. The OLEDs may be over various layers. For example, as illustrated in FIG. 2, the OLEDs may be over a planarization layer or a protective layer 10.

The pixel electrodes 110R, 110G, and 110B may be (semi) transparent electrodes or reflective electrodes. In the case in which the pixel electrodes 110R, 110G, and 110B are the (semi) transparent electrodes, the pixel electrodes 110R, 110G, and 110B may include ITO, IZO, ZnO, $In_2O_3$, IGO, or AZO, for example. In the case in which the pixel electrodes 110R, 110G, and 110B are the reflective electrodes, the pixel electrodes 110R, 110G, and 110B may include a reflective layer including Ag, Mg, Al, Pt, Pd, Au, Ni, Nd, Ir, Cr, or a compound thereof, etc., and a layer including ITO, IZO, ZnO, $In_2O_3$, IGO, or AZO. The inventive concepts are not limited thereto, and the pixel electrodes 110R, 110G, and 110B may include various materials and may have various structures such as a single layer or multiple layers.

Each of the pixel electrodes 110R, 110G, and 110B may be electrically connected to a thin film transistor (not shown). For example, the thin film transistors may be below the planarization layer or the protective layer 10, and the pixel electrodes 110R, 110G, and 110B may be electrically connected to corresponding thin film transistors, respectively, via contact holes in the planarization layer or the protective layer 10. In this case, portions of the pixel electrodes 110R, 110G, and 110B that correspond to the contact holes may be covered with a pixel-defining layer 200.

A portion, not the entire surface, of the pixel electrodes 110R, 110G, and 110B contacts intermediate layers 120R, 120G, and 120B each including an emission layer. That is, the pixel-defining layer 200 covers the edge of each of the pixel electrodes 110R, 110G, and 110B such that the central portion of each of the pixel electrodes 110R, 110G, and 110B is exposed. The pixel-defining layer 200 defines a pixel by having openings respectively correspond to sub-pixels, that is, by having the openings expose the central portions of at least the pixel electrodes 110R, 110G, and 110B. Also, the pixel-defining layer 200 prevents arc, etc. from occurring at the edges of pixel electrodes 110R, 110G, and 110B by increasing a distance between the edge of each of the pixel electrodes 110R, 110G, and 110B and the opposite electrode 130 over the pixel electrodes 110R, 110G, and 110B. The pixel-defining layer 200 may include, for example, an organic material such as polyimide (PI) or hexamethyldisiloxane (HMDSO).

The intermediate layers 120R, 120G, and 120B each including the emission layer may include a low molecular material or a polymer material. In the case in which the intermediate layers 120R, 120G, and 120B include the low molecular material, the intermediate layers 120R, 120G, and 120B may have a structure in which a hole injection layer (HIL), a hole transport layer (HTL), an emission layer (EML), an electron transport layer (ETL), an electron injection layer (EIL), etc. are stacked in a single or composite structure. The intermediate layers 120R, 120G, and 120B may include various organic materials such as copper phthalocyanine (CuPc), N,N'-Di(naphthalene-1-yl)-N,N'-diphenyl-benzidine (NPB), and/or tris-8-hydroxyquinoline aluminum (Alq3). These layers may be formed by using a vacuum deposition method.

In the case in which the intermediate layers 120R, 120G, and 120B include the polymer material, the intermediate layers 120R, 120G, and 120B may generally have a structure including an HTL and an EML. In this case, the HTL may include a PEDOT, and the EML may include a polymer material such as a poly-phenylenevinylene (PPV)-based material and a polyfluorene-based material. The intermediate layers 120R, 120G, and 120B may be formed by using screen printing, an inkjet printing method, or laser induced thermal imaging (LITI), etc.

Though FIG. 2 illustrates that the intermediate layers 120R, 120G, and 120B having a multi-layered structure have a shape patterned to correspond to the pixel electrodes 110R, 110G, and 110B, some of the intermediate layers 120R, 120G, and 120B having the multi-layered structure may have shapes patterned to respectively correspond to the pixel electrodes 110R, 110G, and 110B, and others of the intermediate layers 120R, 120G, and 120B having the multi-layered structure may have one body that corresponds to the pixel electrodes 110R, 110G, and 110B. For example, the emission layers may have shapes patterned to respectively correspond to the pixel electrodes 110R, 110G, and 110B. The HTL, the HIL, the ETL, and/or the EIL, etc. may have one body that corresponds to the pixel electrodes 110R, 110G, and 110B.

As illustrated in FIG. 2, the opposite electrode 130 may have one body that corresponds to a plurality of OLEDs and may correspond to the pixel electrodes 110R, 110G, and 110B. The opposite electrode 130 may be a (semi) transparent electrode or a reflective electrode. When the opposite electrode 130 is the (semi) transparent electrode, the opposite electrode 130 may include a layer including metal having a small work function, such as Li, Ca, LiF/Ca, LiF/Al, Al, Ag, Mg, or a compound thereof, and a (semi) transparent conductive layer including ITO, IZO, ZnO, or $In_2O_3$, etc. When the opposite electrode 130 is the reflective electrode, the opposite electrode 130 may include a layer including Li, Ca, LiF/Ca, LiF/Al, Al, Ag, Mg, or a compound thereof. The configuration and material of the opposite electrode 130 are not limited thereto and may be modified variously.

Since the OLEDs 100R, 100G, and 100B may be easily damaged by external moisture or oxygen, etc., an encapsulation layer 300 may cover the OLEDs 100R, 100G, and 100B and protect the same. As illustrated in FIG. 2, the encapsulation layer 300 may include a first inorganic encapsulation layer 310, an organic encapsulation layer 320, and a second inorganic encapsulation layer 330.

The first inorganic encapsulation layer 310 may cover the opposite electrode 130 and include a silicon oxide, a silicon nitride, and/or a silicon oxynitride, etc. In other embodiments, other layers such as a capping layer may be between the first inorganic encapsulation layer 310 and the opposite electrode 130. Since the first inorganic encapsulation layer 310 is along a structure therebelow, the upper surface of the first inorganic encapsulation layer 310 is not planarized as illustrated in FIG. 2. The organic encapsulation layer 320 may cover the first inorganic encapsulation layer 310. Unlike the first inorganic encapsulation layer 310, the upper surface of the organic encapsulation layer 320 may be approximately planarized. The organic encapsulation layer 320 may include at least one of polyethyleneterephthalate (PET), polyethylene naphthalate (PEN), polycarbonate (PC), PI, polyethylene sulphonate, polyoxy methylene (POM), polyacrylate, and HMDSO. The second inorganic encapsulation layer 330 may cover the organic encapsulation layer 320 and include a silicon oxide, a silicon nitride, and/or a silicon oxynitride. The second inorganic encapsulation layer 330 may prevent the organic encapsulation layer 320 from being exposed to outside by contacting the first inorganic encapsulation layer 310 at the edge of the second inorganic encapsulation layer 330 outside a display area.

Since the thin film encapsulation layer 300 includes the first inorganic encapsulation layer 310, the organic encapsulation layer 320, and the second inorganic encapsulation layer 330, even when a crack occurs inside the encapsulation layer 300, the crack may not be allowed to be connected between the first inorganic encapsulation layer 310 and the organic encapsulation layer 320 or between the organic encapsulation layer 320 and the second inorganic encapsulation layer 330 due to the above-described multi-layered structure. Through this, forming of a path via which external moisture or oxygen, etc. penetrates into the OLEDs 100R, 100G, and 100B may be prevented or minimized.

A lens layer 400 is over the opposite electrode 130, for example, on the encapsulation layer 300. In other embodiments, other elements such as a touch electrode layer, etc. for implementing a touchscreen function may be between the encapsulation layer 300 and the lens layer 400. The lens layer 400 may include a condensing lens and adjust a light path of light occurring from the intermediate layers 120R, 120G, and 120B each including the emission layer. The lens layer 400 includes a condensing lens and adjusts a light path of light traveling in a lateral direction (a direction between +x direction and +z direction, or a direction between −x direction and +z direction) from among light occurring from the intermediate layers 120R, 120G, and 120B each including the emission layer, thereby allowing light to approximately travel in a front direction (+z direction) in which a user is located. Through this, light efficiency may improve by improving the brightness of the display device in the front direction.

The lens layer 400 having the condensing lens may be formed by various methods. As illustrated in FIG. 2, the lens layer 400 having the condensing lens may include a first lens layer 410 and a second lens layer 420. The second lens layer 420 is between the first lens layer 410 and the opposite electrode 130 and has a refractive index less than the refractive index of the first lens layer 410. The condensing lens may be implemented by using the first lens layer 410 and the second lens layer 420 respectively having different refractive indexes.

The second lens layer 420 having a relatively low refractive index is allowed to have a concave portion that is concave in the direction (−z direction) toward the opposite electrode 130. Also, the first lens layer 410 having a relatively high refractive index fills the concave portion. When the first lens layer 410 and the second lens layer 420 are formed as described above, it may be understood that the concave portion of the second lens layer 420 and a corresponding portion of the first lens layer 410 form the condensing lens. Through this, a condensing effect in the front direction (+z direction) may be allowed to appear by changing a path of light passing through an interface between the first lens layer 410 and the second lens layer 420 in the concave portion. The depth of the concave portion of the second lens layer 420 may be about ⅖ to ⅗ of the thickness of a portion of the second lens layer 420 that is not concaved.

While forming the second lens layer 420, the concave portions respectively corresponding to the pixel electrodes 110R, 110G, and 110B are formed as illustrated in FIG. 2 by coating a material layer for the second lens layer 420 and patterning the same. Therefore, when the second lens layer 420 is formed by using a photoresist material, a process of forming the concave portions may be simplified. If the second lens layer 420 is formed by using a different material, i.e., not the photoresist material, the concave portions of the second lens layer 420 may be formed via a process of forming a separate photoresist layer over the material layer for the second lens layer 420, exposing and developing the photoresist layer, and then etching the upper surface of the material layer for the second lens layer 420; and after that, the photoresist layer is removed. Therefore, the process is complicated. In contrast, when the second lens layer 420 is formed by using a photoresist material, e.g., the concave portions are formed in the upper surface of the second lens layer 420 by coating the photoresist material and exposing and developing the same, the second lens layer 420 including the concave portions may be formed via a simple process. The second lens layer 420 may have a refractive index less than that of the first lens layer 410, which is formed later, and the photoresist having the low refractive index may be acrylate. The second lens layer 420 may have a refractive index ranging from about 1.4 to about 1.5.

The first lens layer 410 over the second lens layer 420 may not require separate patterning but may have a refractive index greater than that of the second lens layer 420. To increase a refractive index, the first lens layer 410 may include siloxane and at least one of zirconium oxide particles, aluminum oxide particles, and titanium oxide particles. The first lens layer 410 may have a refractive index of about 1.6 or more and may be formed by using an inkjet printing method or screen printing, etc.

After the intermediate layers 120R, 120G, and 120B, the opposite electrode 130, the encapsulation layer 300, etc. are formed, the lens layer 400 including the first lens layer 410 and the second lens layer 420 may be formed thereon. Damage of the intermediate layers 120R, 120G, and 120B, etc. below the lens layer 400 may be prevented during a process of forming the lens layer 400. Particularly, while forming the lens layer 400, a material that does not require heat-curing at high temperature may be used so that the already formed intermediate layers 120R, 120G, and 120B, etc. would not have to undergo heat-curing at high temperature and avoid being damaged thereby. The above-described material for the first lens layer 410 and material for the second lens layer 420 may be materials that allow heat-curing at low temperature or materials that allow ultraviolet-curing, so that the intermediate layers 120R, 120G, and 120B do not become damaged or influenced.

To increase light-condensing efficiency by using the lens layer 400, the area of a lower surface of the condensing lens may be suitably adjusted. Here, the area of the lower surface of the condensing lens may be understood as an area occupied by a concave portion in the second lens layer 420 in the direction (+z direction) to the first lens layer 410. First, a case of a condensing lens having a circular lower surface represented by a reference numeral L1 in FIG. 3, which is a plan view of the lower surface of a condensing lens of the organic light-emitting display device of FIG. 1, is described.

Figure 3:
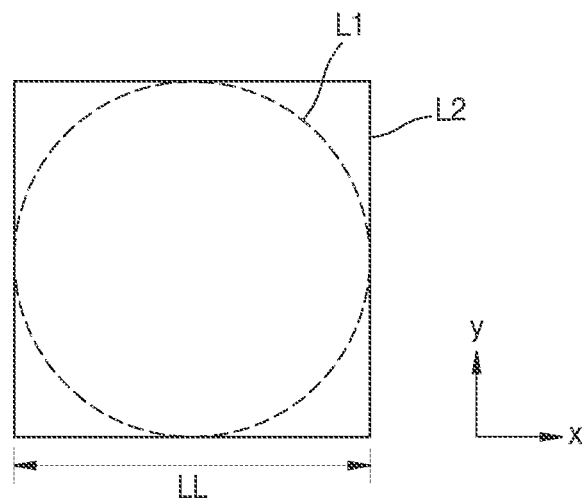
FIG. 3 is a plan view of the lower surface of a condensing lens of the organic light-emitting display device of FIG. 1.
Figure 4:
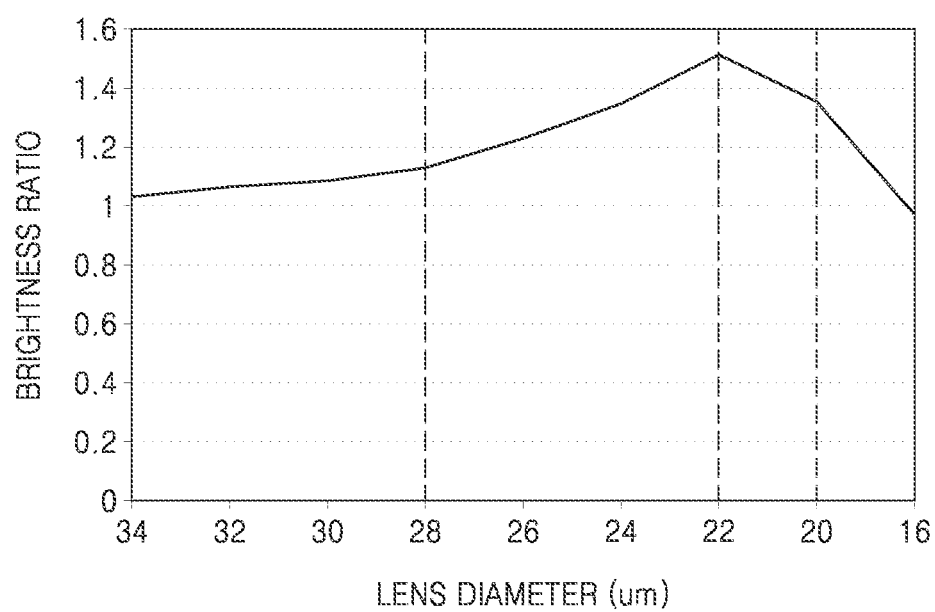
FIG. 4 is a graph of a brightness ratio in a front direction depending on the size of a condensing lens in a red sub-pixel.

FIG. 4 is a graph of a brightness ratio in a front direction depending on the size of a condensing lens in a red sub-pixel 100R. A horizontal axis in FIG. 4 denotes the diameter of the lower surface of the condensing lens in unit of μm, and a vertical axis denotes a brightness ratio. Here, the diameter of the lower surface of the condensing lens denotes a length represented by LL in FIG. 3 and is the diameter of the lower surface of the concave portion of the second lens layer 420 and denotes a length represented by LAR in FIG. 2.

As the graph of FIG. 4 shows, while the area (refer to a reference numeral PAR of FIG. 2) of an exposed portion of the red pixel electrode 110R that is not covered with the pixel-defining layer 200 is fixed, a brightness ratio in the front direction changes as the diameter of the lower surface of the condensing lens changes. Particularly, when the diameter of the lower surface of the condensing lens is about 20 μm, the graph is drastically bent; when the diameter of the lower surface of the condensing lens is about 22 μm, a maximum brightness ratio appears; and when the diameter of the lower surface of the condensing lens is about 28 μm, the graph is also drastically bent. Therefore, an optimal range for the diameter of the lower surface of the condensing lens may be about 20 μm to about 28 μm. When the diameter of the lower surface of the condensing lens is less than about 20 μm or greater than about 28 μm, light efficiency drastically deteriorates.

However, the range of the diameter of the lower surface of the condensing lens that results in optimized light efficiency changes depending on the area of the exposed portion of the red pixel electrode 110R that is not covered with the pixel-defining layer 200. That is, when the area of the exposed portion of the red pixel electrode 110R that is not covered with the pixel-defining layer 200 widens, the upper limit and the lower limit of the diameter of the lower surface of the condensing lens that result in optimized light efficiency also increase, respectively. When the area of the exposed portion of the red pixel electrode 110R that is not covered with the pixel-defining layer 200 narrows, the upper limit and the lower limit of the diameter of the lower surface of the condensing lens that result in optimized light efficiency also reduce, respectively. Therefore, determining the optimal range of the diameter of the lower surface of the condensing lens may require taking into account a ratio of the area of the exposed portion of the red pixel electrode 110R that is not covered with the pixel-defining layer 200 to the area of the lower surface of the condensing lens.

The graph of FIG. 4 illustrates a case in which the area of the exposed portion of the red pixel electrode 110R that is not covered with the pixel-defining layer 200 is about 233.27 $\mu m^2$. Therefore, assuming that the area of the exposed portion of the red pixel electrode 110R that is not covered with the pixel-defining layer 200 is A, and the area of the lower surface of the condensing lens is B, the ratio B/A of the red sub-pixel 100R may be a value ranging from about 1.34 to about 2.63. To represent optimized light efficiency, B/A may be about 1.62.

Figure 5:
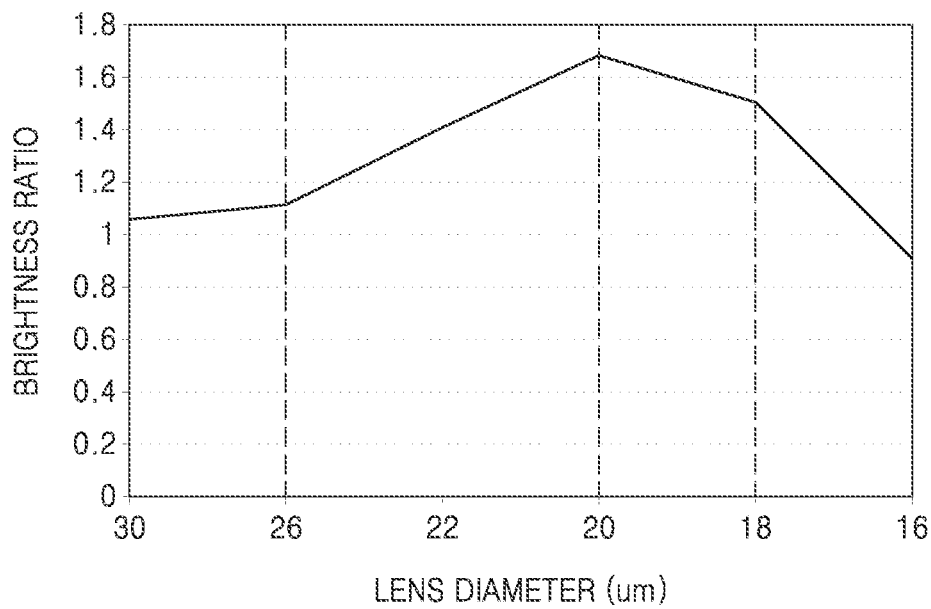
FIG. 5 is a graph of a brightness ratio in a front direction depending on the size of a condensing lens in a green sub-pixel.

FIG. 5 is a graph of a brightness ratio in a front direction depending on the size of a condensing lens in the green sub-pixel 100G of FIG. 2. A horizontal axis in FIG. 5 denotes the diameter of the lower surface of the condensing lens in unit of $\mu m$, and a vertical axis denotes a brightness ratio. Here, the diameter of the lower surface of the condensing lens denotes a length represented by LL in FIG. 3 and is the diameter of the lower surface of the concave portion of the second lens layer 420 and denotes a length represented by LAG in FIG. 2.

As the graph of FIG. 5 shows, while the area (refer to a reference numeral PAG of FIG. 2) of an exposed portion of the green pixel electrode 110G that is not covered with the pixel-defining layer 200 is fixed, a brightness ratio in the front direction changes as the diameter of the lower surface of the condensing lens changes. Particularly, when the diameter of the lower surface of the condensing lens is about 18 $\mu m$, the graph is drastically bent; when the diameter of the lower surface of the condensing lens is about 20 $\mu m$, a maximum brightness ratio appears; and when the diameter of the lower surface of the condensing lens is about 26 $\mu m$, the graph is also drastically bent. Therefore, an optimal range for the diameter of the lower surface of the condensing lens may be about 18 $\mu m$ to about 26 $\mu m$. When the diameter of the lower surface of the condensing lens is less than about 18 $\mu m$ or greater than about 26 $\mu m$, light efficiency drastically deteriorates.

However, the range of the diameter of the lower surface of the condensing lens that results in optimized light efficiency changes depending on the area of the exposed portion of the green pixel electrode 110G that is not covered with the pixel-defining layer 200. That is, when the area of the exposed portion of the green pixel electrode 110G that is not covered with the pixel-defining layer 200 widens, the upper limit and the lower limit of the diameter of the lower surface of the condensing lens that result in optimized light efficiency also increase, respectively. When the area of the exposed portion of the green pixel electrode 110G that is not covered with the pixel-defining layer 200 narrows, the upper limit and the lower limit of the diameter of the lower surface of the condensing lens that result in optimized light efficiency also reduce, respectively. Therefore, determining the optimal range of the diameter of the lower surface of the condensing lens may require taking into account a ratio of the area of the exposed portion of the green pixel electrode 110G that is not covered with the pixel-defining layer 200 to the area of the lower surface of the condensing lens.

The graph of FIG. 5 illustrates a case in which the area of the exposed portion of the green pixel electrode 110G that is not covered with the pixel-defining layer 200 is about 176.89 $\mu m^2$. Therefore, assuming that the area of the exposed portion of the green pixel electrode 110G that is not covered with the pixel-defining layer 200 is A, and the area of the lower surface of the condensing lens is B, the ratio B/A of the green sub-pixel 100G may be a value ranging from about 1.43 to about 3.00. To represent optimized light efficiency, B/A may be about 1.77.

Figure 6:
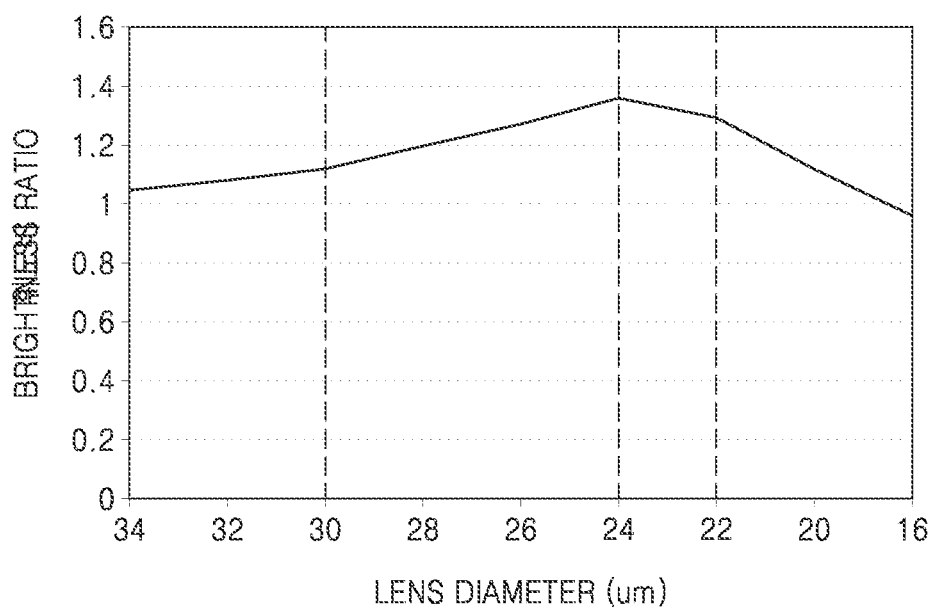
FIG. 6 is a graph of a brightness ratio in a front direction depending on the size of a condensing lens in a blue sub-pixel.

FIG. 6 is a graph of a brightness ratio in a front direction depending on the size of a condensing lens in the blue sub-pixel 100B of FIG. 2. A horizontal axis in FIG. 6 denotes the diameter of the lower surface of the condensing lens in unit of $\mu m$, and a vertical axis denotes a brightness ratio. Here, the diameter of the lower surface of the condensing lens denotes a length represented by LL in FIG. 3 and is the diameter of the lower surface of the concave portion of the second lens layer 420 and denotes a length represented by LAB in FIG. 2.

As the graph of FIG. 6 shows, while the area (refer to a reference numeral PAB of FIG. 2) of an exposed portion of the blue pixel electrode 110B that is not covered with the pixel-defining layer 200 is fixed, a brightness ratio in the front direction changes as the diameter of the lower surface of the condensing lens changes. Particularly, when the diameter of the lower surface of the condensing lens is about 22 $\mu m$, the graph is drastically bent; when the diameter of the lower surface of the condensing lens is about 24 $\mu m$, a maximum brightness ratio appears; and when the diameter of the lower surface of the condensing lens is about 30 $\mu m$, the graph is also drastically bent. Therefore, an optimal range for the diameter of the lower surface of the condensing lens may be about 22 $\mu m$ to about 30 $\mu m$. When the diameter of the lower surface of the condensing lens is less than about 22 $\mu m$ or greater than about 30 $\mu m$, light efficiency drastically deteriorates.

However, the range of the diameter of the lower surface of the condensing lens that results in optimized light efficiency changes depending on the area of the exposed portion of the blue pixel electrode 110B that is not covered with the pixel-defining layer 200. That is, when the area of the exposed portion of the blue pixel electrode 110B that is not covered with the pixel-defining layer 200 widens, the upper limit and the lower limit of the diameter of the lower surface of the condensing lens that result in optimized light efficiency also increase, respectively. When the area of the exposed portion of the blue pixel electrode 110B that is not covered with the pixel-defining layer 200 narrows, the upper limit and the lower limit of the diameter of the lower surface of the condensing lens that result in optimized light efficiency also reduce, respectively. Therefore, determining the optimal range of the diameter of the lower surface of the condensing lens may require taking into account a ratio of the area of the exposed portion of the blue pixel electrode 110B that is not covered with the pixel-defining layer 200 to the area of the lower surface of the condensing lens.

The graph of FIG. 6 illustrates a case in which the area of the exposed portion of the blue pixel electrode 110B that is not covered with the pixel-defining layer 200 is about 290.40 $\mu m^2$. Therefore, assuming that the area of the exposed portion of the blue pixel electrode 110B that is not covered with the pixel-defining layer 200 is A, and the area of the lower surface of the condensing lens is B, the ratio B/A of the blue sub-pixel 100B may be a value ranging from about 1.30 to about 2.43. To represent optimized light efficiency, B/A may be about 1.55.

Up to now, the case of the condensing lens having the lower surface like the circle represented by the reference numeral L1 in FIG. 3, which is a plan view of the lower surface of the condensing lens of the organic light-emitting display device of FIG. 1 has been described. Hereinafter, a case of a condensing lens having a lower surface shape of a quadrangle, specifically, a square represented by a reference numeral L2 in FIG. 3, which is a plan view of the lower surface of the condensing lens of the organic light-emitting display device of FIG. 1, is described.

While the area (refer to a reference numeral PAR of FIG. 2) of the exposed portion of the red pixel electrode 110R that is not covered with the pixel-defining layer 200 is fixed, when the length (a length represented by LL in FIG. 3) of one side of the lower surface of the condensing lens having a square lower surface changes, a brightness ratio in the front direction changes. However, it has been revealed that if the area of the exposed portion of the red pixel electrode 110R that is not covered with the pixel-defining layer 200 is the same, the brightness in the front direction is the same regardless of whether the lower surface is a square or a circle, as long as the length (the length represented by LL in FIG. 3) of one side of the lower surface of the condensing lens having a square lower surface is the same as the diameter (the length represented by LL in FIG. 3) of the lower surface of the condensing lens having a circular lower surface.

That is, under a circumstance in which the area of the exposed portion of the red pixel electrode 110R that is not covered with the pixel-defining layer 200 is fixed as about 233.27 $\mu m^2$, a graph of a change in a brightness ratio in a front direction while changing the length (the length represented by LL in FIG. 3) of one side of the lower surface of the condensing lens having a square lower surface is the same as the graph of FIG. 4, which is a graph of a change in a brightness ratio in a front direction while changing the diameter (the length represented by LL in FIG. 3) of the condensing lens having a circular lower surface. Even in this case, it has been revealed that when the length of one side of the lower surface of the condensing lens having the square lower surface is about 20 $\mu m$, the graph is drastically bent; when the length of one side is about 22 $\mu m$, a maximum brightness ratio appears; and when the length of one side is about 28 $\mu m$, the graph is also drastically bent. Therefore, an optimal range for the length of one side of the lower surface of the condensing lens having the square lower surface may be about 20 $\mu m$ to about 28 $\mu m$. When the length of one side of the lower surface of the condensing lens having the square lower surface is less than about 20 $\mu m$ or greater than about 28 $\mu m$, light efficiency drastically deteriorates.

Similar to the description above, the range of the length of one side of the lower surface of the condensing lens having the square lower surface that results in the above-described optimized light efficiency changes depending on the area of the exposed portion of the red pixel electrode 110R that is not covered with the pixel-defining layer 200. That is, when the area of the exposed portion of the red pixel electrode 110R that is not covered with the pixel-defining layer 200 widens, the upper limit and the lower limit of the length of one side of the lower surface of the condensing lens having the square lower surface that result in optimized light efficiency also increase, respectively. When the area of the exposed portion of the red pixel electrode 110R that is not covered with the pixel-defining layer 200 narrows, the upper limit and the lower limit of the length of one side of the lower surface of the condensing lens having the square lower surface that result in optimized light efficiency also reduce, respectively. Therefore, determining the optimal range of the length of one side of the lower surface of the condensing lens having the square lower surface may require taking into account a ratio of the area of the exposed portion of the red pixel electrode 110R that is not covered with the pixel-defining layer 200 to the area of the lower surface of the condensing lens having the square lower surface.

The graph of FIG. 4 illustrates a case in which the area of the exposed portion of the red pixel electrode 110R that is not covered with the pixel-defining layer 200 is about 233.27 $\mu m2$. Therefore, assuming that the area of the exposed portion of the red pixel electrode 110R that is not covered with the pixel-defining layer 200 is A, and the area of the lower surface of the condensing lens having the square lower surface is B, the ratio B/A of the red sub-pixel 100R may be a value ranging from about 1.71 to about 3.36. To represent optimized light efficiency, B/A may be about 2.07.

The discussion made for the red sub-pixel 100R is also applicable to the green sub-pixel 100G. That is, under a circumstance in which the area of the exposed portion of the green pixel electrode 110G that is not covered with the pixel-defining layer 200 is fixed as about 233.27 $\mu m^2$, a graph of a change in a brightness ratio in a front direction while changing the length (the length represented by LL in FIG. 3) of one side of the lower surface of the condensing lens having a square lower surface is the same as the graph of FIG. 5, which is a graph of a change in a brightness ratio in a front direction while changing the diameter (the length represented by LL in FIG. 3) of the condensing lens having a circular lower surface.

Even in this case, it has been revealed that when the length of one side of the lower surface of the condensing lens having the square lower surface is about 18 $\mu m$, the graph is drastically bent; when the length of one side is about 20 $\mu m$, a maximum brightness ratio appears; and when the length of one side is about 26 $\mu m$, the graph is also drastically bent. Therefore, the length of one side of the lower surface of the condensing lens having the square lower surface may be about 18 $\mu m$ to about 26 $\mu m$. When the length of one side of the lower surface of the condensing lens having the square lower surface is less than about 18 $\mu m$ or greater than about 26 $\mu m$, light efficiency drastically deteriorates.

Similar to the description above, the range of the length of one side of the lower surface of the condensing lens having the square lower surface that results in the above-described optimized light efficiency changes depending on the area of the exposed portion of the green pixel electrode 110G that is not covered with the pixel-defining layer 200. Therefore, determining the optimal range of the length of one side of the lower surface of the condensing lens having the square lower surface may require taking into account a ratio of the area of the exposed portion of the green pixel electrode 110G that is not covered with the pixel-defining layer 200 to the area of the lower surface of the condensing lens having the square lower surface.

The graph of FIG. 5 illustrates a case in which the area of the exposed portion of the green pixel electrode 110G that is not covered with the pixel-defining layer 200 is about 176.89 $\mu m^2$. Therefore, assuming that the area of the exposed portion of the green pixel electrode 110G that is not covered with the pixel-defining layer 200 is A, and the area of the lower surface of the condensing lens having the square lower surface is B, the ratio B/A of the green sub-pixel 100G may be a value ranging from about 1.83 to about 3.82. To represent optimized light efficiency, B/A may be about 2.26.

The discussions made for the red sub-pixel 100R and the green sub-pixel 100G are also applicable to the blue sub-pixel 100B. That is, under a circumstance in which the area of the exposed portion of the blue pixel electrode 110B that is not covered with the pixel-defining layer 200 is fixed as about 290.40 µm², a graph of a change in a brightness ratio in a front direction while changing the length (the length represented by LL in FIG. 3) of one side of the lower surface of the condensing lens having a square lower surface is the same as the graph of FIG. 6, which is a graph of a change in a brightness ratio in a front direction while changing the diameter (the length represented by LL in FIG. 3) of the condensing lens having a circular lower surface.

Even in this case, it has been revealed that when the length of one side of the lower surface of the condensing lens having the square lower surface is about 22 µm, the graph is drastically bent; when the length of one side is about 24 µm, a maximum brightness ratio appears; and when the length of one side is about 30 µm, the graph is also drastically bent. Therefore, the length of one side of the lower surface of the condensing lens having the square lower surface may be about 22 µm to about 30 µm. When the length of one side of the lower surface of the condensing lens having the square lower surface is less than about 22 µm or greater than about 30 µm, light efficiency drastically deteriorates.

Similar to the description above, the range of the length of one side of the lower surface of the condensing lens having the square lower surface that results in the over-described optimized light efficiency changes depending on the area of the exposed portion of the blue pixel electrode 110B that is not covered with the pixel-defining layer 200. Therefore, determining the optimal range of the length of one side of the lower surface of the condensing lens having the square lower surface may require taking into account a ratio of the area of the exposed portion of the blue pixel electrode 110B that is not covered with the pixel-defining layer 200 to the area of the lower surface of the condensing lens having the square lower surface.

The graph of FIG. 6 illustrates a case in which the area of the exposed portion of the blue pixel electrode 110B that is not covered with the pixel-defining layer 200 is about 290.40 µm². Therefore, assuming that the area of the exposed portion of the blue pixel electrode 110B that is not covered with the pixel-defining layer 200 is A, and the area of the lower surface of the condensing lens having the square lower surface is B, the ratio B/A of the blue sub-pixel 100B may be a value ranging from about 1.66 to about 3.09. To represent optimized light efficiency, B/A may be about 1.98.

Up to now, though the case in which the lower surface of the condensing lens is a square or a circle has been described, the embodiments are not limited thereto.

If the areas of the exposed portions of the red pixel electrode 110R that are not covered with the pixel-defining layer 200 are the same as described above, the brightness in the front direction is the same regardless of whether the lower surface is a square or a circle, as long as the length (the length represented by LL in FIG. 3) of one side of the lower surface of the condensing lens having the square lower surface is the same as the diameter (the length represented by LL in FIG. 3) of the lower surface of the condensing lens having the circular lower surface. That is, under a circumstance in which the area of the exposed portion of the red pixel electrode 110R that is not covered with the pixel-defining layer 200 is fixed as about 233.27 µm², a graph of a change in a brightness ratio in a front direction while changing the length (the length represented by LL in FIG. 3) of one side of the lower surface of the condensing lens having a square lower surface is the same as the graph of FIG. 4, which is a graph of a change in a brightness ratio in the front direction while changing the diameter (the length represented by LL in FIG. 3) of the condensing lens having the circular lower surface.

Figure 7:
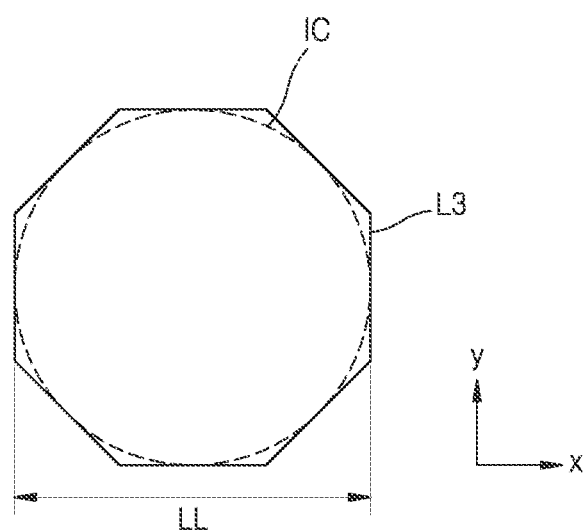
FIG. 7 is a plan view of the lower surface of a condensing lens of an organic light-emitting display device according to another embodiment.

Furthermore, the same/similar description may be made to even a case in which the lower surface of a condensing lens included in the lens layer, represented by a reference numeral L3, is a polygon in FIG. 7, which is a plan view of the lower surface of a condensing lens of an organic light-emitting display device according to another embodiment. That is, under a circumstance in which the area of the exposed portion of the red pixel electrode 110R that is not covered with the pixel-defining layer 200 is fixed as about 233.27 µm², when measuring a change in the brightness ratio in the front direction while changing the size of the polygon such that the diameter (a length represented by LL in FIG. 7) of a virtual circle IC (i.e., an incircle or inscribed circle) having a maximum size which may be located inside the polygon changes in the lower surface of the condensing lens, a graph that has the diameter of the virtual circle IC of the maximum size as a horizontal axis and a brightness ratio as a vertical axis is the same as the graph of FIG. 4, which is a graph of a change in the brightness ratio in the front direction while changing the diameter (the length represented by LL in FIG. 3) of the condensing lens having the circular lower surface.

Likewise, under a circumstance in which the area of the exposed portion of the green pixel electrode 110G that is not covered with the pixel-defining layer 200 is fixed as about 176.89 µm², when measuring a change in the brightness ratio in the front direction while changing the size of the polygon such that the diameter (the length represented by LL in FIG. 7) of the virtual circle IC having a maximum size which may be located inside the polygon changes in the lower surface of the condensing lens having the lower polygonal surface, a graph that has the diameter of the virtual circle IC of the maximum size as a horizontal axis and a brightness ratio as a vertical axis is the same as the graph of FIG. 5, which is a graph of a change in the brightness ratio in the front direction while changing the diameter (the length represented by LL in FIG. 3) of the condensing lens having the circular lower surface. Also, under a circumstance in which the area of the exposed portion of the blue pixel electrode 110B that is not covered with the pixel-defining layer 200 is fixed as about 290.40 µm², when measuring a change in the brightness ratio in the front direction while changing the size of the polygon such that the diameter (the length represented by LL in FIG. 7) of the virtual circle IC having a maximum size which may be located inside the polygon changes in the lower surface of the condensing lens having the lower polygonal surface, a graph that has the diameter of the virtual circle IC of the maximum size as a horizontal axis and a brightness ratio as a vertical axis is the same as the graph of FIG. 6, which is a graph of a change in the brightness ratio in the front direction while changing the diameter (the length represented by LL in FIG. 3) of the condensing lens having the circular lower surface.

Therefore, assuming that the area of the exposed portion of the red pixel electrode 110R that is exposed by the pixel-defining layer 200 is A, and the area of the virtual circle IC having a maximum size that may be located inside the polygon in the lower surface of the condensing lens having the lower polygonal surface is B, the B/A of the red sub-pixel 100R may be about 1.34 to about 2.63. To represent optimized light efficiency, B/A may be 1.62.

In other embodiments, assuming that the area of the exposed portion of the green pixel electrode 110G that is exposed by the pixel-defining layer 200 is A, and the area of the virtual circle IC having a maximum size that may be located inside the polygon in the lower surface of the condensing lens having the lower polygonal surface is B, the ratio B/A of the green sub-pixel 100G may be about 1.43 to about 3.00. To represent optimized light efficiency, B/A may be 1.77. Also, in other embodiments, assuming that the area of the exposed portion of the blue pixel electrode 110B that is exposed by the pixel-defining layer 200 is A, and the area of the virtual circle IC having a maximum size that may be located inside the polygon in the lower surface of the condensing lens having the lower polygonal surface is B, the ratio B/A of the blue sub-pixel 100B may be about 1.30 to about 2.43. To represent optimized light efficiency, B/A may be 1.55.

The descriptions in over embodiments for the refractive index of the first lens layer 410 or the second lens layer 420, or the process of forming the first lens layer 410 or the second lens layer 420, or materials which may be used for this process, etc. are applicable to the display device including the condensing lens having the lower polygonal surface as described above.

Though the inventive concept has been described with reference to the embodiments illustrated in the drawings, this is merely exemplary, and it will be understood by those of ordinary skill in the art that various changes in form and details and equivalents thereof may be made therein without departing from the spirit and scope of the inventive concept as defined by the following claims.

What is claimed is:

1. An organic light-emitting display device comprising:
   a plurality of pixel electrodes, each corresponding to one of at least a first pixel, a second pixel, and a third pixel;
   a pixel-defining layer covering an edge of each of the pixel electrodes and exposing a central portion of each of the pixel electrodes;
   an intermediate layer over the pixel electrode, the intermediate layer comprising an emission layer;
   an opposite electrode over the intermediate layer;
   an encapsulation layer over the opposite electrode, the encapsulation layer comprising at least one inorganic encapsulation layer and at least one organic encapsulation layer;
   a touch electrode layer disposed between the encapsulation layer and a lens layer; and
   the lens layer directly on the touch electrode layer, the lens layer comprising a first lens layer and a second lens layer between the first lens layer and the touch electrode layer, the second lens layer having a refractive index less than the refractive index of the first lens layer,
   wherein the second lens layer comprises a first portion concave in a direction toward the encapsulation layer and a second portion located outside the first portion, and the first lens layer comprises a third portion filling the first portion and a fourth portion located outside the third portion,
   wherein each of the first portion and the third portion overlaps the central portion of each of the pixel electrodes exposed by the pixel-defining layer, and
   wherein each of the second portion and the fourth portion overlaps the pixel defining layer.

2. The display device of claim 1, wherein a thickness of the third portion is greater than a thickness of the first portion.

3. The display device of claim 1, wherein a thickness of the second portion is greater than a thickness of the fourth portion.

4. The display device of claim 1, each of the second portion and the fourth portion does not overlap the central portion of each of the pixel electrodes exposed by the pixel-defining layer.

5. The display device of claim 1, wherein the second lens layer comprises a photoresist.

6. The display device of claim 1, wherein the second lens layer comprises acrylate.

7. The display device of claim 1, wherein the first lens layer or the second lens layer comprises a material cured by irradiation of an ultraviolet ray.

8. The display device of claim 1, wherein the first lens layer comprises siloxane and at least one of zirconium oxide, aluminum oxide, and titanium oxide.

9. The display device of claim 1, wherein the lens layer comprises a plurality of condensing lenses and each of the plurality of condensing lenses has a circular lower surface.

10. The display device of claim 9, wherein an area of the central portion of a pixel electrode corresponding to the first pixel and exposed by the pixel-defining layer is Ar, an area of the lower surface of a condensing lens over the first pixel is Br, and the ratio Br/Ar ranges from about 1.34 to about 2.63;
   wherein an area of the central portion of a pixel electrode corresponding to the second pixel and exposed by the pixel-defining layer is Ag, an area of the lower surface of a condensing lens over the second pixel is Bg, and the ratio Bg/Ag ranges from about 1.43 to about 3.00; and
   wherein an area of the central portion of a pixel electrode corresponding to the third pixel and exposed by the pixel-defining layer is Ab, an area of the lower surface of a condensing lens over the third pixel is Bb, and the ratio Bb/Ab ranges from about 1.30 to about 2.43.

11. The display device of claim 10, wherein the ratio Br/Ar is about 1.62, the ratio Bg/Ag is about 1.77, and the ratio Bb/Ab is about 1.55.

12. The display device of claim 1, wherein the lens layer comprises a plurality of condensing lenses and each of the plurality of condensing lenses has a quadrangular lower surface.

13. The display device of claim 12, wherein an area of the central portion of a pixel electrode corresponding to the first pixel and exposed by the pixel-defining layer is Ar, an area of the lower surface of a condensing lens over the first pixel is Br, and the ratio Br/Ar ranges from about 1.71 to about 3.36;
   wherein an area of the central portion of a pixel electrode corresponding to the second pixel and exposed by the pixel-defining layer is Ag, an area of the lower surface of a condensing lens over the second pixel is Bg, and the ratio Bg/Ag ranges from about 1.83 to about 3.82; and
   wherein an area of the central portion of a pixel electrode corresponding to the third pixel and exposed by the pixel-defining layer is Ab, an area of the lower surface of a condensing lens over the third pixel is Bb, and the ratio Bb/Ab ranges from about 1.66 to about 3.09.

14. The display device of claim 13, wherein the ratio Br/Ar is about 2.07, the ratio Bg/Ag is about 2.26, and the ratio Bb/Ab is about 1.98.

15. The display device of claim 1, wherein the lens layer comprises a plurality of condensing lenses and each of the plurality of condensing lenses has a polygonal lower surface.

16. The display device of claim 15, wherein an area of the central portion of a pixel electrode corresponding to the first pixel and exposed by the pixel-defining layer is Ar, an area of a biggest circle that would fit inside the polygonal lower surface of a condensing lens over the first pixel is Br, and the ratio Br/Ar ranges from about 1.34 to about 2.63;
wherein an area of the central portion of a pixel electrode corresponding to the second pixel and exposed by the pixel-defining layer is Ag, an area of a biggest circle that would fit inside the polygonal lower surface of a condensing lens over the second pixel is Bg, and the ratio Bg/Ag ranges from about 1.43 to about 3.00; and
wherein an area of the central portion of a pixel electrode corresponding to the third pixel and exposed by the pixel-defining layer is Ab, an area of a biggest circle that would fit inside the polygonal lower surface of a condensing lens over the third pixel is Bb, and the ratio Bb/Ab ranges from about 1.30 to about 2.43.

17. The display device of claim 16, wherein the ratio Br/Ar is about 1.62, the ratio Bg/Ag is about 1.77, and the ratio Bb/Ab is about 1.55.

18. An organic light-emitting display device comprising:
a plurality of pixel electrodes;
a pixel-defining layer covering an edge of each of the pixel electrodes and exposing a central portion of each of the pixel electrodes;
an intermediate layer over the pixel electrode, the intermediate layer comprising an emission layer;
an opposite electrode over the intermediate layer;
an encapsulation layer over the opposite electrode, the encapsulation layer comprising at least one inorganic encapsulation layer and at least one organic encapsulation layer;
a touch electrode layer disposed between the encapsulation layer and a lens layer; and
the lens layer over the touch electrode layer, the lens layer comprising a first lens layer and a second lens layer between the first lens layer and the touch electrode layer, the second lens layer having a refractive index less than the refractive index of the first lens layer,
wherein the second lens layer comprises a first portion concave in a direction toward the encapsulation layer and a second portion located outside the first portion, and the first lens layer comprises a third portion filling the first portion and a fourth portion located outside the third portion,
wherein each of the second portion and the fourth portion overlaps the pixel-defining layer, and
wherein each of the second portion and the fourth portion does not overlap the central portion of each of the pixel electrodes exposed by the pixel-defining layer.

19. The display device of claim 18, wherein the lens layer comprises a plurality of condensing lenses and each of the plurality of pixel electrodes corresponds to one of at least a first pixel, a second pixel, and a third pixel;
wherein each of the plurality of condensing lenses has a circular lower surface;
wherein an area of the central portion of a pixel electrode corresponding to the first pixel and exposed by the pixel-defining layer is Ar, an area of the lower surface of a condensing lens over the first pixel is Br, and the ratio Br/Ar ranges from about 1.34 to about 2.63;
wherein an area of the central portion of a pixel electrode corresponding to the second pixel and exposed by the pixel-defining layer is Ag, an area of the lower surface of a condensing lens over the second pixel is Bg, and the ratio Bg/Ag ranges from about 1.43 to about 3.00; and
wherein an area of the central portion of a pixel electrode corresponding to the third pixel and exposed by the pixel-defining layer is Ab, an area of the lower surface of a condensing lens over the third pixel is Bb, and the ratio Bb/Ab ranges from about 1.30 to about 2.43.

20. The display device of claim 18, wherein the lens layer comprises a plurality of condensing lenses and each of the plurality of pixel electrodes corresponds to one of at least a first pixel, a second pixel, and a third pixel;
wherein each of the plurality of condensing lenses has a quadrangular lower surface;
wherein an area of the central portion of a pixel electrode corresponding to the first pixel and exposed by the pixel-defining layer is Ar, an area of the lower surface of a condensing lens over the first pixel is Br, and the ratio Br/Ar ranges from about 1.71 to about 3.36;
wherein an area of the central portion of a pixel electrode corresponding to the second pixel and exposed by the pixel-defining layer is Ag, an area of the lower surface of a condensing lens over the second pixel is Bg, and the ratio Bg/Ag ranges from about 1.83 to about 3.82; and
wherein an area of the central portion of a pixel electrode corresponding to the third pixel and exposed by the pixel-defining layer is Ab, an area of the lower surface of a condensing lens over the third pixel is Bb, and the ratio Bb/Ab ranges from about 1.66 to about 3.09.

21. The display device of claim 18, wherein the lens layer comprises a plurality of condensing lenses and each of the plurality of pixel electrodes corresponds to one of at least a first pixel, a second pixel, and a third pixel;
wherein each of the plurality of condensing lenses has a polygonal lower surface;
wherein an area of the central portion of a pixel electrode corresponding to the first pixel and exposed by the pixel-defining layer is Ar, an area of a biggest circle that would fit inside the polygonal lower surface of a condensing lens over the first pixel is Br, and the ratio Br/Ar ranges from about 1.34 to about 2.63;
wherein an area of the central portion of a pixel electrode corresponding to the second pixel and exposed by the pixel-defining layer is Ag, an area of a biggest circle that would fit inside the polygonal lower surface of a condensing lens over the second pixel is Bg, and the ratio Bg/Ag ranges from about 1.43 to about 3.00; and
wherein an area of the central portion of a pixel electrode corresponding to the third pixel and exposed by the pixel-defining layer is Ab, an area of a biggest circle that would fit inside the polygonal lower surface of a condensing lens over the third pixel is Bb, and the ratio Bb/Ab ranges from about 1.30 to about 2.43.

* * * * *